United States Patent [19]

Chu et al.

[11] 4,193,445

[45] Mar. 18, 1980

[54] CONDUCTION COOLED MODULE

[75] Inventors: Richard C. Chu; Un-pah Hwang; Robert E. Simons, all of Poughkeepsie, N.Y.

[73] Assignee: International Business Machines Corporation, Armonk, N.Y.

[21] Appl. No.: 920,904

[22] Filed: Jun. 29, 1978

[51] Int. Cl.² .................................... H01L 23/42
[52] U.S. Cl. ............................ 165/79; 165/80 B; 165/80 C; 165/185; 361/387
[58] Field of Search ............... 165/80 R, 80 B, 80 C, 165/185, DIG. 8, 79; 357/81, 82, 79; 361/389, 387, 386; 174/15 R, 16 HS

[56] References Cited

U.S. PATENT DOCUMENTS

| 2,928,162 | 3/1960 | Marinale | 357/81 |
| 3,199,000 | 8/1965 | Nippert | 357/81 |
| 3,993,123 | 11/1976 | Chu et al. | 165/80 C |
| 4,069,498 | 1/1978 | Joshi | 165/80 B |

OTHER PUBLICATIONS

Technique for Heat-Sinking to Lower K, Bowers et al., IBM Technical Disclosure Bulletin, vol. 4, No. 10, Mar. 1962, p. 53.
Structural Concept for Module with Improved Heat Transfer Characteristics, Arnold et al., IBM Technical Disclosure Bulletin, vol. 20, No. 6, Dec. 1977, pp. 2675-2676.
Design for Providing Thermal Interface Material Between Narrow Thermal Interface Gaps, Chu, IBM Technical Disclosure Bulletin, vol. 20, No. 7, Dec. 1977, pp. 2761-2762.
Solid Encapsulated Module, Chu et al., IBM Technical Disclosure Bulletin, vol. 21, No. 6, Nov. 1978, pp. 2435-2436.

Primary Examiner—Sheldon Richter
Attorney, Agent, or Firm—Harold H. Sweeney, Jr.

[57] ABSTRACT

An improved conduction cooled module of the type having at least one chip mounted on a substrate and having a housing surrounding the chips and sealed to the substrate. The housing having cylinders therein opposite the chips for containing pistons which are resiliently urged against the chip surface. Each piston has an opening extending from the top to the bottom surface and has at least one circumferential groove located in the outer wall of the piston. The opening and circumferential grooves are preloaded with a low melt point heat conductive material which is reflowed after assembly into the module to fill the interfaces formed between the piston and chip and the piston and cylinder. Grooves are located in the piston walls forming the interfaces which facilitate the flow of the molten material into the interfaces.

12 Claims, 9 Drawing Figures

CONDUCTION COOLED MODULE

DESCRIPTION

Technical Field

This invention relates to an improved conduction cooled module for removing heat from electronic chips or the like, and pertains more particularly to a piston in the module which carries a low melt point conductive material therein which melts upon the application of heat to the module filling the heat transfer interfaces, thereby, improving the heat transfer from the chip and through the module.

One object of the present invention is to provide an improved conduction cooled module in which the heat transfer from the chips and through the module is improved.

Another object of the present invention is to provide a conduction cooled module having a piston which can be preloaded with a material which can be reflowed and distributed to fill the heat transfer interfaces in the module after assembly.

Another object of the present invention is to provide a conduction cooled module in which shock and vibration damage to the chip are limited.

Another object of the present invention is to provide a conduction cooled module in which various levels of coolability can be easily obtained by the proper mixture of materials.

BACKGROUND ART

In the prior art, U.S. Pat. No. 3,993,123, issued Nov. 23, 1976 sets forth a gas encapsulated cooling module for removing the heat from heat generating components mounted on a substrate. A heat conductive cap is sealed to the substrate enclosing the heat generating components. The wall of the cap opposite the substrate contains elongated openings therein extending towards the heat generating components and on the same centers with respect thereto. A resilient member is located in the cap in communion with the inner end of the openings. A thermal conductive element is located in each of the openings forming a small peripheral gap between each opening wall and the associated thermal conductive element. The resilient member urges the thermal conductive elements into pressure contact with the heat generating components. A thermal conductive inert gas is located within the cap filling the peripheral gaps and the interfaces between the heat generating elements and the thermal conductive elements. Maintaining a seal, which contains the gas within the module for the lifetime of the element, is difficult. Also, the gas has limited heat conductivity properties, thereby, limiting the heat transfer across the gaps associated with the heat transfer path. The spring loaded thermal conductive element can produce vibration and shock problems in connection with the fragile chip. These problems in the prior art are overcome by the present invention, which provides a thermal conductive material in the heat transfer gaps which lowers the gap thermal resistance, and is sufficiently solid to dampen vibration and shock. The provision of a solid thermal conductive material in the gaps relaxes the sealing problems encountered with the prior art gas encapsulated modules.

BRIEF DESCRIPTION OF THE DRAWINGS

In the accompanying drawings forming a material part of this disclosure.

DISCLOSURE OF THE INVENTION

For further comprehension of the invention, and of the objects and advantages thereof, reference will be had to the following description and accompanying drawings, and to the appended claims in which the various novel features of the invention are more particularly set forth.

Figure 1:
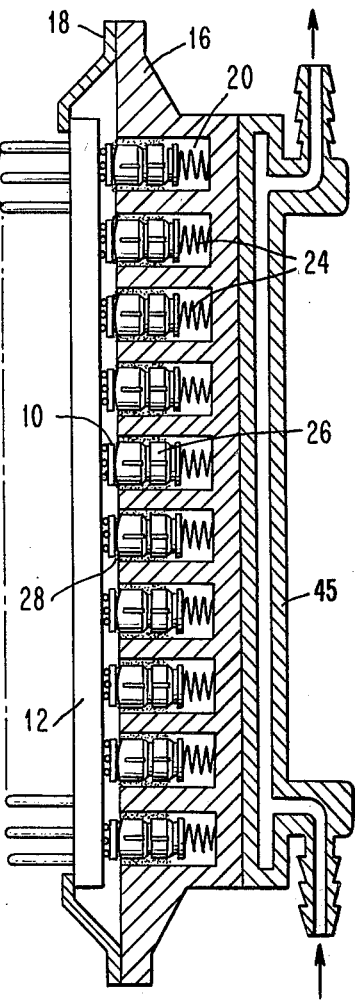
FIG. 1 is a vertical cross-sectional side view of a module showing the interfaces filled with heat conductive solid material.

Referring to FIG. 1, there is shown a cross-sectional view of a conduction cooled module capable of providing cooling of the solid state electronic chips to be cooled. As is well known, the chip consists of integrated circuits and devices which are densely packed on each chip. The power consumed in the circuits within the chip generates heat which must be removed from the chip. Since the various circuits have different power requirements, and since the integrated components thereon must be maintained within certain temperature ranges for reliable operation, the cooling must be of such character as to maintain the chip temperature within the required operating range.

Figure 2:
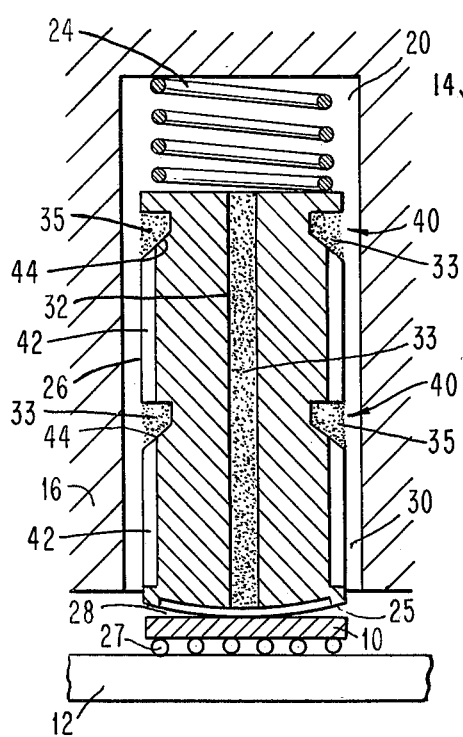
FIG. 2 is a blown up cross-sectional view showing one of the pistons within a cylinder with the thermal conductive material contained in the piston, that is, before reflow.
Figure 3:
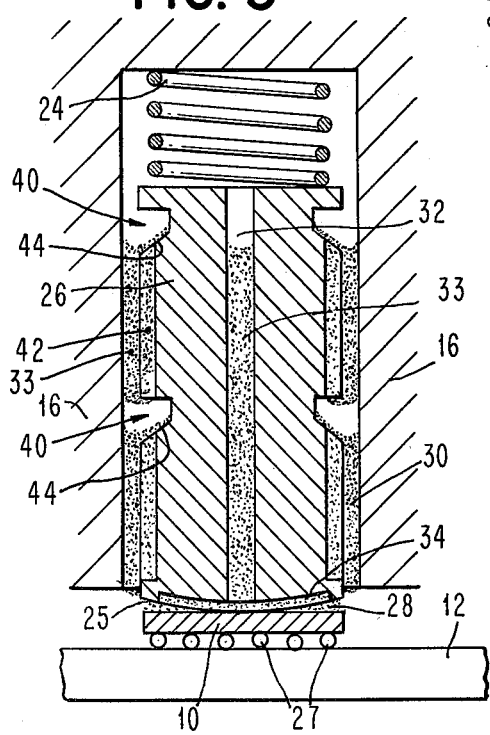
FIG. 3 is a blown up cross-sectional view of a single piston within the cylinder with the thermal conductive material reflowed into the interfaces.

The chips 10 are mounted on one side of a substrate 12, generally made of multi-layer ceramic, which has pins 14 extending from the other side thereof. These connecting pins 14 provide for the plugging of the module into a board (not shown) which may very well carry auxiliary circuits, etc. A container or cap 16 is attached to the substrate 12 by means of a flange 18 which extends from the periphery of the substrate 12 to the cap 16. The cap 16 is made of a good heat conductive material such as copper or aluminum. The cap 16 is sufficiently thick to provide openings 20 therein. A spring means 24 is located in each opening 20 at the bottom thereof. The openings or holes 20 within the cap member 16 are accurately sized to receive a thermal conductive piston 26, one end of which abuts the spring member 24 and the other end of which abuts the face of the chip 10 forming an interface 28 therebetween. As can be seen in FIGS. 2 and 3, piston 26 is dimensioned such that a small annular gap 30 exists between its circumference and the side walls of the hole or cylinder 20 in the cap 16. The gap 30 is kept as small as possible but not so small as to frictionally impede the in and out movement of the piston 26. Thus, the spring force on piston 26 applies a predetermined pressure of the piston 26 against the thermal element or chip 10 to provide a good thermal contact.

Figure 6:
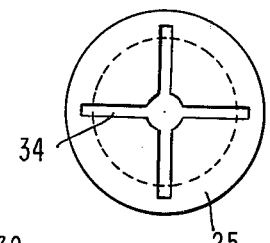
FIG. 6 is a blown up bottom view of one of the pistons showing the micro-grooves therein.

The piston 26 has a slightly convex or crowned end surface which contacts the chip 10 surface. This bottom surface 25 of the piston 26 is curved such that there will be a maximum amount of surface contact between the bottom surface of the piston and the back surface of the chip 10 regardless of the chip tilt. As can be seen from FIGS. 2 and 3, the chips 10 are mounted mainface down, that is facing toward the substrate 12, on solder balls 27. The solder ball 27 attachment of the chip 10 to the substrate 12 does not consistently provide a level chip. The piston 26 has an opening 32 extending through the piston 26 from the top surface to the bottom surface thereof. FIGS. 3 and 6 show radial microgrooves 34 extending radially from the opening 32 to near the periphery of the bottom crown surface 25 of the piston 26. A low melting point thermal conductive material 33 such as wax is utilized to fill the opening 32 in the piston 26 before assembly. The wax 33 could be in the form of a solid dowel and mechanically slid into the opening 32 or it could be heated and allowed to flow into the opening 32. After assembly of the piston 26 into the module, the module is heated causing the wax to reflow. The micro-grooves 34 provide a channel for the wax to travel along. The wax 33 will extend into the grooves 34 by a combination of the gravitational force on the wax in the opening and capillary action. These micro-grooves 34 are instrumental in getting the wax 33 out along the radial areas of the interface between the bottom 25 of the piston 26 and the back of the chip 10. The wax 33 will fill the small gap 28 between the bottom face 25 of the piston 26 and the back side of the chip 10 by capillary action. It can be seen that the wax 33 must be of sufficiently low viscosity to flow along the micro-grooves 34 and to spread by capillary action into the interface areas. The actual wax used was an elastic-type of wax called Ultraflex Amber Microwax manufactured by Mitchell Rand Corp. The melting point of the wax must be sufficiently high that it will remain solid after reflow when subjected to the chip heat. The melting point of the wax must be sufficiently low that the heat of reflow does not cause problems in the module, for example, it must be below the temperature of reflow of the solder balls connecting the chip 10 to the substrate 12. The reflow temperature utilized was approximately 80° C. The wax 33 during reflow within the module does not flow out of the interface 28 between the bottom face 25 of the stud or piston 26 and the back of the chip 10, but is held therein by surface tension.

Figure 5:
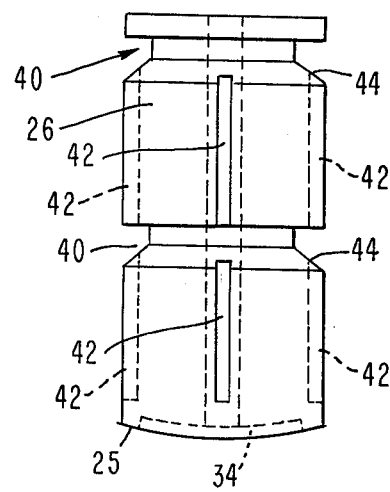
FIG. 5 is a blown up side view of one of the pistons before the thermal conductive material is added thereto.
Figure 4:
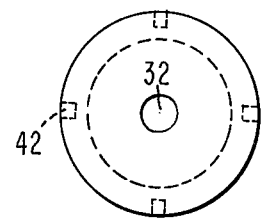
FIG. 4 is a blown up top view of one of the pistons.

As can be best seen in FIG. 5, the thermal piston 26 is shown as having circumferential grooves 40 around the periphery of the piston. The number of grooves 40 is a function of the length of the piston 26, the dimensions of the gap 30 between the cylinder housing 16 and the piston 26, the piston diameter and the depth of the circumferential groove 40. These circumferential grooves 40 are preloaded with a low melt point, good thermal conductive material, such as wax 33, similar to the preloading of opening 32 in the piston 26. The wax 33 can be preloaded in the form of a solid ring 35 (see FIG. 2). The size of the ring 35 being predetermined by the area of the gap 30 between the cylinder housing 16 and the piston 26 to be filled. Micro-channels 42 extend from the circumferential grooves 40 vertically to the next circumferential groove or in the case of the bottom circumferential groove, the micro-channels 42 extend to a point near the end surface 25 of the piston 26. As was set forth in connection with the wax 33 loaded in the opening 32 of the piston 26, the wax 33 loaded in the circumferential grooves 40 is melted by applying heat after the piston 26 is located in the module. It should be noted that the bottom side surface 44 of the circumferential grooves 40 extend downward to facilitate the flow of the wax from the circumferential groove 40 into the gap 30 to be filled. Also, the vertical micro-channels 42 facilitate the flow of the wax 33 from the circumferential grooves 40 and aid in the distribution of the wax 33 throughout the gap 30. The flow of the wax 33 is accomplished by gravitational force as well as the spreading by capillary action. FIG. 2 shows the rings 35 of wax 33 located in the circumferential grooves 40 with the piston 26 assembled into the module but before the application of heat for reflow of the wax. FIG. 3 similarly shows the piston 26 assembled in the module but after the heat has been applied and the wax ring 35 reflowed into the gap 30 between the cylinder housing 16 and the piston 26 wall. The volume of wax contained in both the opening 32 and the circumferential grooves 40 in the piston 26 is predetermined to be sufficient to fill the respective gaps.

It has been found that for an aluminum piston, optimum heat transfer can be obtained with a length of 15.2 mm and a diameter of 5.5 mm. The opening 32 through the piston 26 can be made in two stages for manufacturing ease, (see FIG. 7). The upper half of the opening is approximately 1 mm in diameter and the bottom half is approximately 0.5 mm in diameter. The circumferential grooves 40 were made approximately 1 mm wide whereas the three vertical micro-channels 42 were made 0.5 mm square. The micro-grooves 34 in the bottom surface 25 of the piston 26 were made approximately 0.13 mm wide and 0.13 mm deep. It was found that three or four such radial grooves 34 were sufficient to serve as feedlines for the molten wax 33 in order to fill the entire gap 28. The piston 26, after loading of the wax 33 therein and assembly into the module and after being heated in an oven to cause the reflow of the wax into the gaps 28 and 30 is allowed to cool, the wax 33 forms a relatively solid connection between the housing cylinder 16 wall and the piston 26 wall thereby providing a dampening effect to shock. In the helium filled gap type module of the prior art a shock or high inertia force often caused the piston to slam into the spring, causing the spring to compress and, correspondingly, force the piston back down against the chip with sufficient force to damage the fragile chip. As just mentioned, the solid wax 33 for the most part, prevents vibration and shock damage caused by the piston 26 being forced against the chip 10.

The wax 33 generally has a thermal conductivity which is twice that of helium. Therefore, the gap resistance between the chip 10 surface and the bottom surface 25 of the piston 26 is reduced as well as the thermal resistance between the peripheral wall of the piston 26 and the cylinder housing 16 wall. Other advantages of using wax are that the wax may be readily removed for rework, is compatible with the chip and module, has low cost, and simplifies the module sealing. The thermal conductivity of plain wax is about 0.27 watts/m K and can be greatly increased with the addition of filler material. The wax can have zinc oxide powder mixed therein to enhance the thermal conductivity. A thermal conductivity six times greater than helium has been obtained, approximately 0.865 watts/m.·K, using filler materials. Similarly, aluminum oxide powder can be utilized as a mix with the wax to increase the thermal conductivity thereof.

Figure 8:
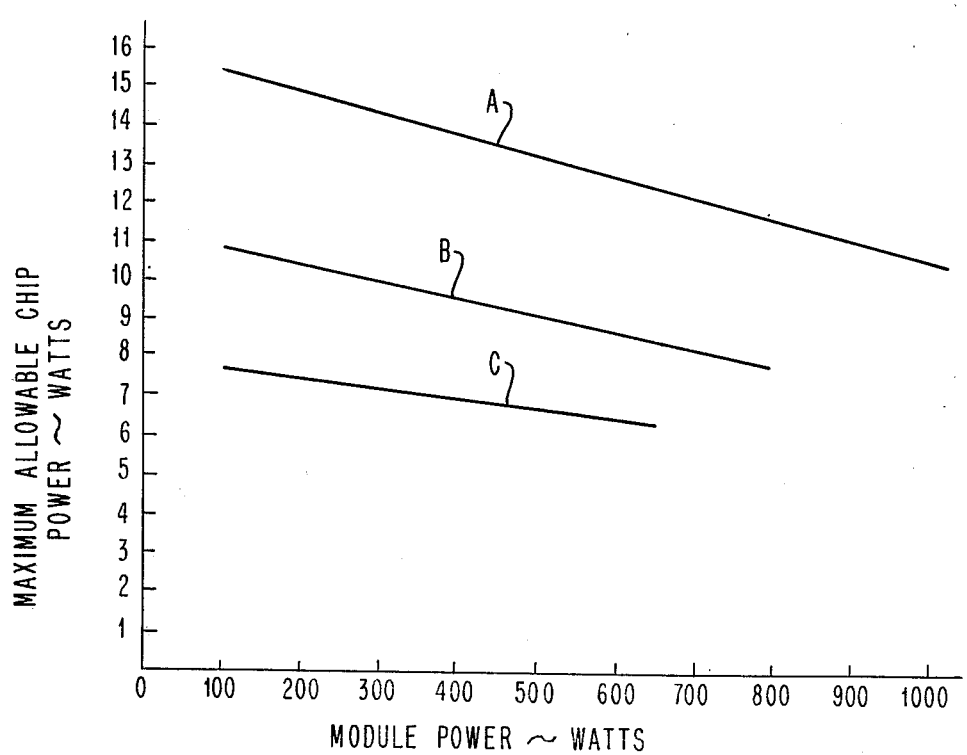
FIG. 8 is a graph of maximum allowable chip power vs. module power.

Referring to FIG. 8, there is shown a plot of the maximum allowable chip power in watts vs. the module power in watts using various materials within the module. This gives an indication of the cooling capability of the module and more particularly the improved performance obtained for various materials. For example, line A on the graph is a plot of the results obtained using a copper piston with the interfaces filled with a mixture of wax and a filler material such as zinc oxide powder. It can be seen that the maximum allowable chip power in a module consuming 100 watts is 15½ watts. Plot B was obtained using a copper piston and plain wax in the interfaces. It can be seen that the maximum allowable chip power is 10.8 watts in a module consuming 100 watts. Similarly, plot C shows that an aluminum piston with plain wax in the interfaces in the module limits the maximum allowable chip power to 7.8 watts in a 100 watt module. Thus, it can be seen that there is considerable difference in the cooling capability using plain wax or filled wax in the interfaces and also considerable difference in the cooling capability between a copper and aluminum piston.

As can be seen from FIGS. 1, 2 and 3 the heat transfer path is from the chip 10 to the bottom surface 25 of the piston 26 across the interface 28 therebetween and from the piston 26 to the cylinder housing 16 across the interface gap 30 between the piston 26 peripheral wall and the cylinder 16 wall. Thus, the module must be designed to obtain the required heat transfer rate to maintain the chip 10 within its required operating range. This is done through the selection of the material in the interface gaps and the material selected for the housing and the piston. The heat accumulated in the housing 16 from each of the pistons 26 is transferred to a cold plate 45 which is attached to the housing 16. The housing 16 surface is relatively flat so that the cold plate 45 can be attached thereto in good thermal conductive relation. The housing 16 can also serve as the wall of the cold plate 45. The cold plate 45 has a cooling liquid circulated therethrough which removes the heat transferred to the cold plate.

The module is not limited to the cold plate type of exterior heat removal. The outer surface of the housing 16 can have fins extending therefrom such that air can be forced thereacross to remove the heat.

It should be noted that the module must be oriented during the heating cycle such that the piston is essentially vertical so that the wax can run down the interface surfaces to be filled by gravitational force. However, once the cooling of the wax to its solid form takes place, the module can be operated independent of its orientation. Accordingly, it will work in a low gravity or zero gravity environment such as in space or on the lunar surface.

Figure 9:
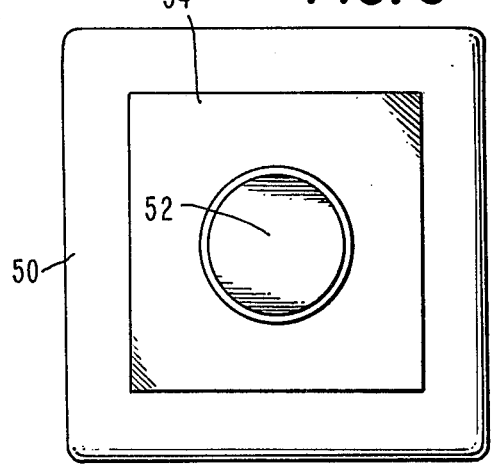
FIG. 9 is a plan view of the single chip air cooled module showing the square configuration of the cooling fins.
Figure 7:
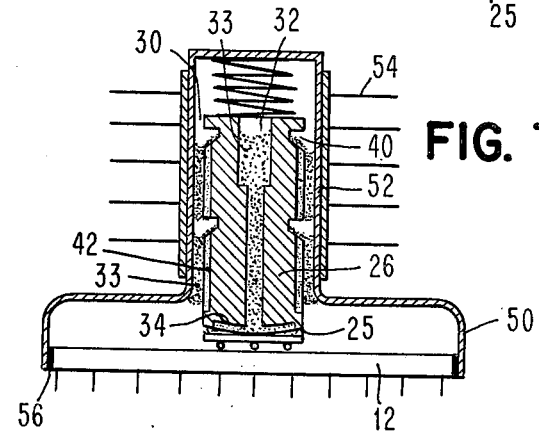
FIG. 7 is another embodiment showing a single chip air cooled module.

Since the stringent sealing requirements necessary for containing the helium have been relaxed by replacing the helium with wax in the interfaces, the large massive housing is no longer required. Referring to FIG. 7, there is shown a further embodiment of the invention showing only a single chip 10 to be cooled with a spring loaded piston 26 urged against the back surface thereof. The piston 26 is the same as previously described, that is, with an opening 32 filled with wax 33 and radial micro-grooves 34 on the bottom surface thereof for enhancing the filling of the interface between the chip 10 and the bottom surface 25 of the piston 26 with the wax 33 during reflow. The piston 26 also contains 5 circumferential grooves 40 for preloading with wax 33 and the vertical micro-channels 42 for enhancing the flow of the wax during the heating cycle to fill the interface between the piston 26 and the housing 50 with the wax. The housing 50 is shown as a light weight metallic element having essentially a raised or stove-hat like portion 52 thereon which forms the housing wall of the annular interface 30. This housing 50 can be made of superplastic material such as zinc aluminum alloy. This light weight material can be molded into the desired shape and has good heat conductive qualities. The housing 50 having the stove-hat extention 52 can be easily extended to a plurality of chip cooling arrangements by molding the housing 50 with a number of stove-hat portions 52, one for each chip. The cooling can be provided by press fitting cooling fins 54 onto the stove-hat portion 52 of the housing 50 to give sufficient surface area for blowing air to remove the heat. The fins 54 are constructed with a square peripheral configuration to maximize the available fin surface for convective heat transfer (see FIG. 9). The bottom of the housing 50 can be attached to the substrate 12 using a thermosetting silicone material to create a simple seal 56. The seal 56 is only necessary to keep the corrosive ambient atmosphere away from the chip. It does not have to contain a gas such as helium.

The high heat conductivity of materials such as wax and the ability of the material to fill the gaps during reflow heating and remain in the gap when solidified, thereby providing a low thermal resistance interface, have been utilized to provide a cooling unit for solid state electronic chips which must be kept within a specific thermal operating range. Also, various levels of coolability may be obtained by utilization of the proper combination of piston, housing materials and wax. The performance may be further enhanced through the use of thermally conductive filler materials mixed with the wax. Also, the wax in the annulus interface provides a highly viscous or semi-solid piston to case connection, eliminating the potential for piston rebound under a shock and vibration environment.

While we have illustrated and described the preferred embodiments of our invention, it is to be understood that we do not limit ourselves to the precise constructions herein disclosed and the right is reserved to all changes and modifications coming within the scope of the invention as defined in the appended claims.

Having thus described our invention, what we claim as new, and desire to secure by Letters Patent is:

1. In a conduction cooled module for cooling electronic chips having at least one piston located in a housing cylinder forming an annular interface between the piston wall and the corresponding cylinder wall and having an end of each piston bearing against a corresponding chip to be cooled forming an interface therebetween;

said piston having a top and bottom surface and an outer wall and an opening extending from the top to the bottom surface;

radial grooves extending from the bottom end of the opening to near the periphery of the bottom surface of said piston;

at least one circumferential groove located in the outer wall of said piston;

vertical grooves extending downward from said circumferential grooves until they intercept another circumferential groove or terminate near the bottom surface of said piston which contacts the chip;

a low melt point heat conductive material located in the opening in said piston;

a ring of said low melt point heat conductive material located in each of said circumferential grooves;

means for heating the module above the melting temperature of said material so that said material flows from the opening in said piston along said radial grooves and fills the interface between said piston and chip and flows from said circumferential grooves into said annular interface and along said vertical grooves and fills the annular interface between said piston and cylinder wall, thereby lowering the interface resistances and enhancing the cooling heat transfer.

2. In a conduction cooled module according to claim 1, wherein the opening in said piston has a diameter great enough in conjunction with its length to provide sufficient low melt point heat conductive material to completely fill the interface between the bottom surface of said piston and the chip.

3. In a conduction cooled module according to claim 1, wherein said radial grooves are sufficiently deep to provide capillary flow of said material along said radial grooves in sufficient quantity to fill the entire interface between the bottom surface of the piston and the surface of the chip during said heating.

4. In a conduction cooled module according to claim 1, wherein the number, placement and depth of said circumferential grooves are selected to each contain a large enough ring of low melt point heat conductive material to collectively fill the entire interface between the piston wall and the corresponding housing cylinder wall during said heating.

5. In a conduction cooled module according to claim 1, wherein said circumferential grooves have the bottom side thereof tapered downward to facilitate the flow of said low melt point heat conductive material into said interface between the housing cylinder wall and said piston wall.

6. In a conduction cooled module according to claim 1, wherein said vertical grooves are sufficiently deep and spaced circumferentially close enough with respect to one another to provide sufficient material flow during the heating cycle to complete the filling of the interface between the housing cylinder wall and said piston wall.

7. In a conduction cooled module according to claim 1, wherein said low melt point heat conductive material is wax.

8. In a conduction cooled module according to claim 7, wherein said wax has thermal conductive metal powder mixed therewith to enhance the thermal conductivity.

9. In a conduction cooled module according to claim 8, wherein said thermal conductive metal powder is zinc oxide.

10. In a conduction cooled module according to claim 8, wherein said thermal conductive metal powder is aluminum oxide.

11. In a conduction cooled module according to claim 1, wherein said cylinder housing is a high heat conductive material formed into a thin tubular configuration to serve as the cylinder for said piston and forming the cylinder wall of the annular interface and having cooling fins attached to and extending out from said tubular cylinder housing adapting the module for air cooling.

12. In a conduction cooled module according to claim 11, wherein said cooling fins are constructed with a square perimeter, instead of circular, to maximize convective heat transfer surface area.

* * * * *